(12) United States Patent  (10) Patent No.: US 7,320,607 B2
Kim et al.  (45) Date of Patent: Jan. 22, 2008

(54) MAIN BOARD FOR PORTABLE TERMINAL

(75) Inventors: Hong-Gu Kim, Gyeonggi-do (KR);
Jae-Sun Park, Suwon-si (KR);
Kee-Dug Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/029,817

(22) Filed: Jan. 5, 2005

(65) Prior Publication Data

US 2005/0197014 A1    Sep. 8, 2005

(30) Foreign Application Priority Data

Mar. 2, 2004    (KR) .................. 10-2004-0013918

(51) Int. Cl.
*H01R 12/00*    (2006.01)
(52) U.S. Cl. .................. 439/76.1; 361/760
(58) Field of Classification Search ............ 439/629, 439/65, 165, 76.1; 361/760, 715, 686, 737
See application file for complete search history.

(56) References Cited

U.S. PATENT DOCUMENTS 5,711,013 A * 1/1998 Collett et al. .............. 455/558
5,883,787 A * 3/1999 Reier .......................... 361/752
6,257,902 B1 * 7/2001 Shieh ......................... 439/76.1
6,261,106 B1 * 7/2001 Tung ........................... 439/79
6,352,434 B1 * 3/2002 Emmert ....................... 439/65

* cited by examiner

*Primary Examiner*—Neil Abrams
*Assistant Examiner*—Phuongchi Nguyen
(74) *Attorney, Agent, or Firm*—The Farrell Law Firm, PC

(57)    ABSTRACT

Disclosed is a main board of a portable terminal including a socket receiving an additional device, such as a memory card and being installed at one side of the main board, an interface connector attached to a printed circuit board, and a battery terminal attached to the printed circuit board. The interface connector and the battery terminal form a stacked structure together with the socket. The main board of the portable terminal is provided at a predetermined portion thereof with a stacked structure of the socket for receiving the memory card, the interface connector, and the battery terminal, thereby minimizing mounting space required for the above elements, ensuring mounting space for installing other parts, and efficiently utilizing part mounting space. The socket and the interface connector are located adjacent to each other, and the socket and the interface connector are exposed through a common opening, thereby making the assembly for the portable terminal more efficient.

5 Claims, 4 Drawing Sheets

MAIN BOARD FOR PORTABLE TERMINAL

PRIORITY

This application claims priority to an application entitled "MAIN BOARD FOR PORTABLE TERMINAL" filed with the Korean Intellectual Property Office on Mar. 2, 2004 and assigned Ser. No. 2004-13918, the contents of which are incorporated herein by reference.

BACKGROUND OF THE INVENTION

1. Field of the Invention

The present invention relates to portable terminals, and more particularly to a main board of a portable terminal, on which a socket for an interface connector, a battery terminal, and a memory card is mounted.

2. Description of the Related Art

In general, "portable communication apparatus" or "portable terminal" refers to an electronic apparatus which allows a user to wirelessly communicate with other users via a service provider base station using the portable communication apparatus.

Early portable terminals provided services, such as a voice communication service and a short message service. As electronic/information communication techniques developed, portable terminals began to provide multi-media services such as an image communication service and a VOD (Video On Demand) service, and are often equipped with voice recording and digital camera functions.

To accommodate the above services, portable terminals typically require an interface connector for connecting the portable terminal to another electronic/information apparatus, such as a personal computer, and also typically require a storage medium, such as a memory card, capable of storing a large amount of electronic data, such as moving pictures.

FIG. 1 is an exploded perspective view showing a conventional portable terminal 100 equipped with a main board 103, and FIG. 2 is a perspective view showing a rear surface of the main board 103 of the portable terminal 100 shown in FIG. 1. The portable terminal 100 shown in FIG. 1 is a folder-type terminal including a main body 101 and a folder 102.

The main body 101 includes a front case 101a and a rear case 101b. The front case 101a includes a key pad 111 and a transmitting unit 113, and the main board 103 is mounted on the main body 101.

The folder 102 is hingably connected to the main body 101, and is rotatably movable between an open position and a closed position with respect to the main body 101. A camera lens 104 is mounted between the main body 101 and the folder 102, that is, on a hinge unit, in such a manner that image communication and photographing of a desired subject can be achieved using the portable terminal 100.

A plurality of dome switches 131 are mounted on a front surface of the main board 103, and an interface connector 133 is installed at an end of the main board 103. The dome switches 131 are aligned with corresponding key buttons that form the key pad 111, and, if a user presses a key button, the corresponding dome switch 131 generates an electrical signal corresponding to the pressed key button.

Referring to FIG. 2, a socket 137 for receiving a memory card therein, a SIM-card socket 139, and a battery terminal connector 135 are mounted on a rear surface of the main board 103.

The socket 137 is exposed to an exterior through an opening 117 (FIG. 1) formed at one side of the portable terminal 100 to allow insertion of the memory card into the socket 137. The SIM-card socket 139 is exposed to an exterior through a mounting hole 115 formed in the rear case 101b of the main body 101 such that a SIM-card, in which personal information of a user is recorded, is coupled to the SIM-card socket 139.

However, the main board of the portable terminal having the construction described above additionally requires the socket for receiving the memory card therein, so that space available for mounting other parts on the main board is reduced. In addition, because the socket occupies a large area on the main board as compared with another parts, the socket causes a problem of using more space on the main board than is required.

SUMMARY OF THE INVENTION

Accordingly, the present invention has been made to solve the above-mentioned problems occurring in the prior art, and an object of the present invention is to provide a main board of a portable terminal capable of efficiently ensuring mounting space for a additional parts.

In order to accomplish the above object, there is provided a main board of a portable terminal, the main board includes a socket receiving an additional device, such as a memory card and being installed at one side of the main board; an interface connector attached to a printed circuit board; and a battery terminal attached to the printed circuit board, wherein the interface connector and the battery terminal form a stacked structure together with the socket.

BRIEF DESCRIPTION OF THE DRAWINGS

The above and other object, features and advantages of the present invention will be more apparent from the following detailed description taken in conjunction with the accompanying drawing, in which.

DETAILED DESCRIPTION OF THE PREFERRED EMBODIMENTS

Hereinafter, preferred embodiments of the present invention will be described with reference to the accompanying drawings. In the following description of the present invention, a detailed description of known functions and configurations incorporated herein will be omitted to avoid making the subject matter of the present invention unclear.

Figure 1:
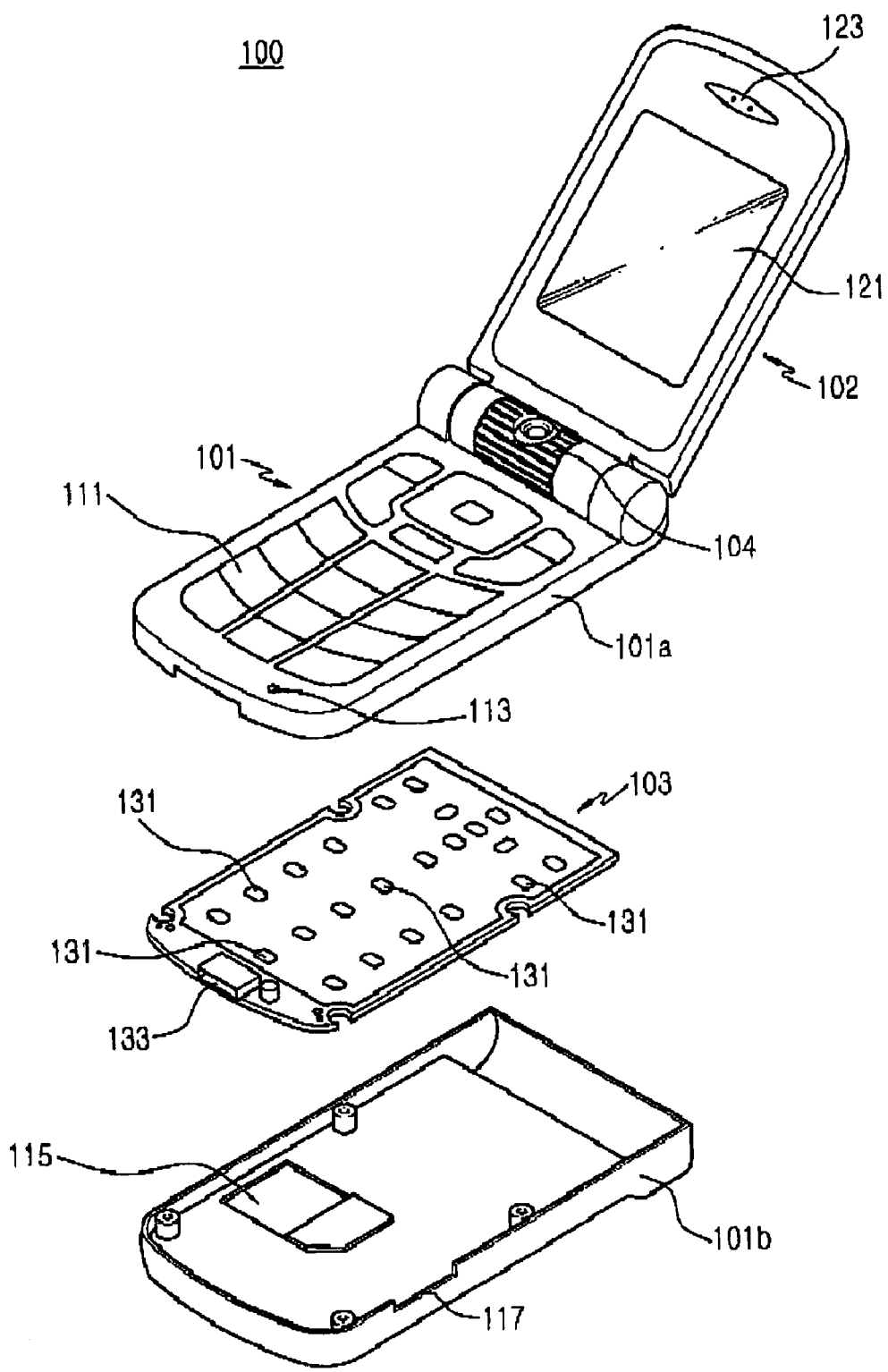
FIG. 1 is an exploded perspective view showing a conventional portable terminal equipped with a main board.
Figure 2:
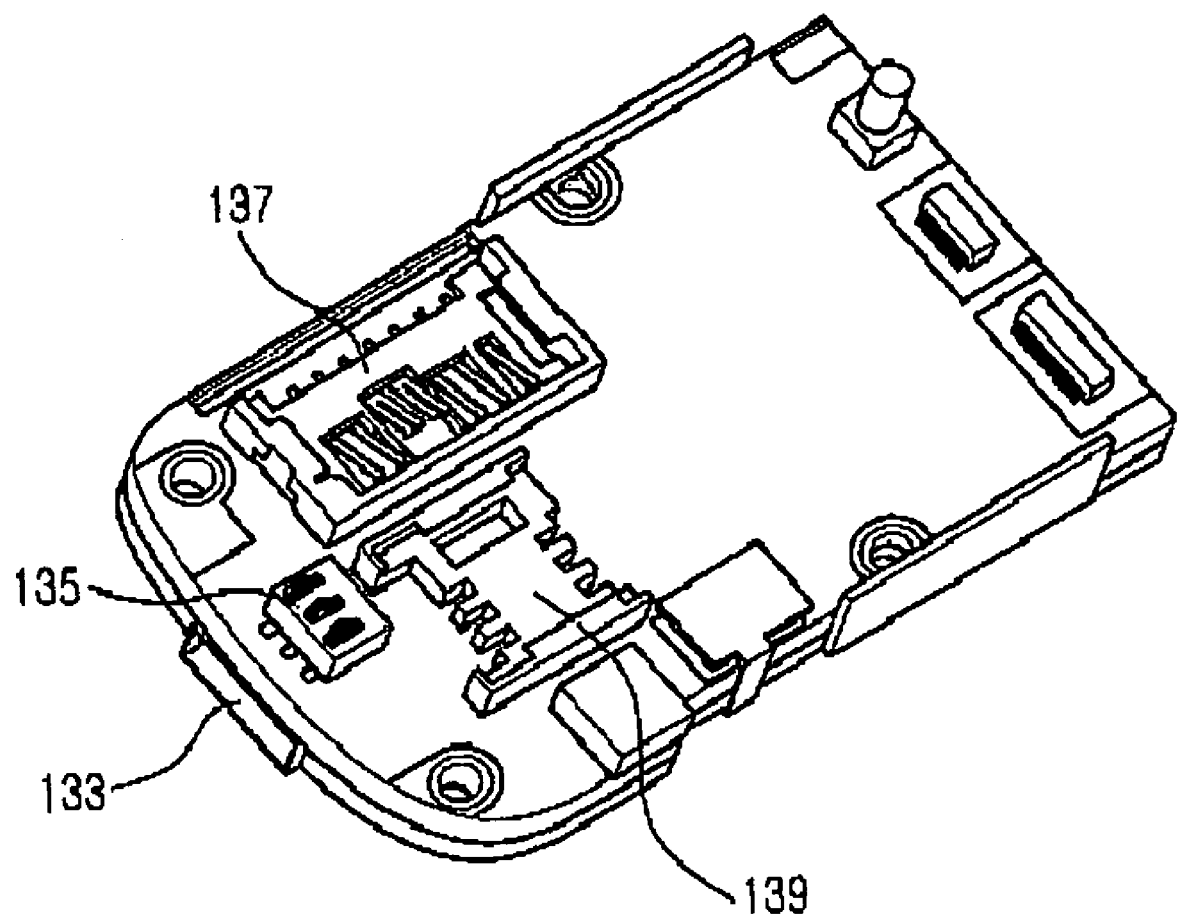
FIG. 2 is a perspective view showing a rear surface of the main board of the conventional portable terminal shown in FIG. 1.
Figure 3:
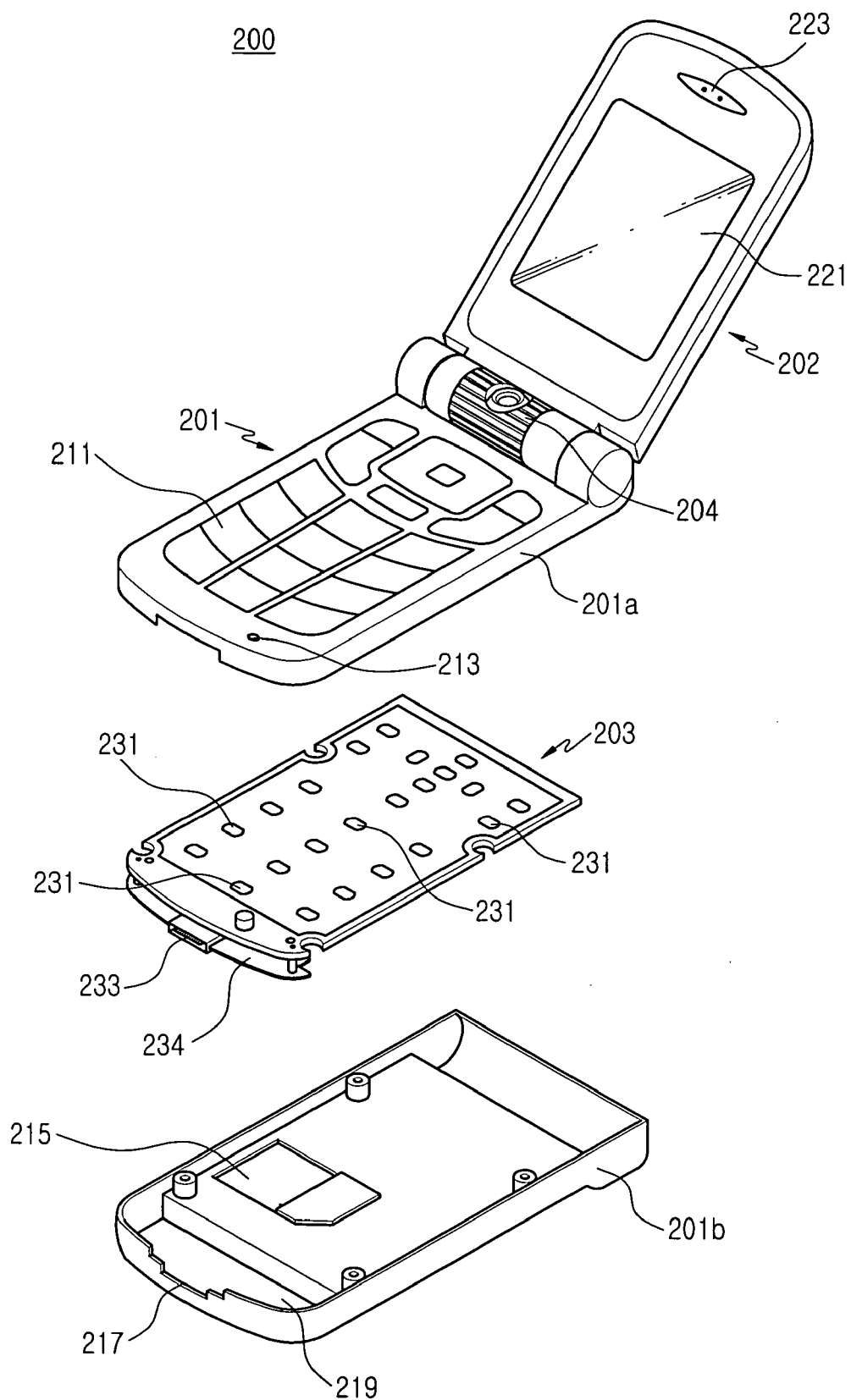
FIG. 3 is an exploded perspective view showing a portable terminal equipped with a main board according to a preferred embodiment of the present invention.
Figure 4:
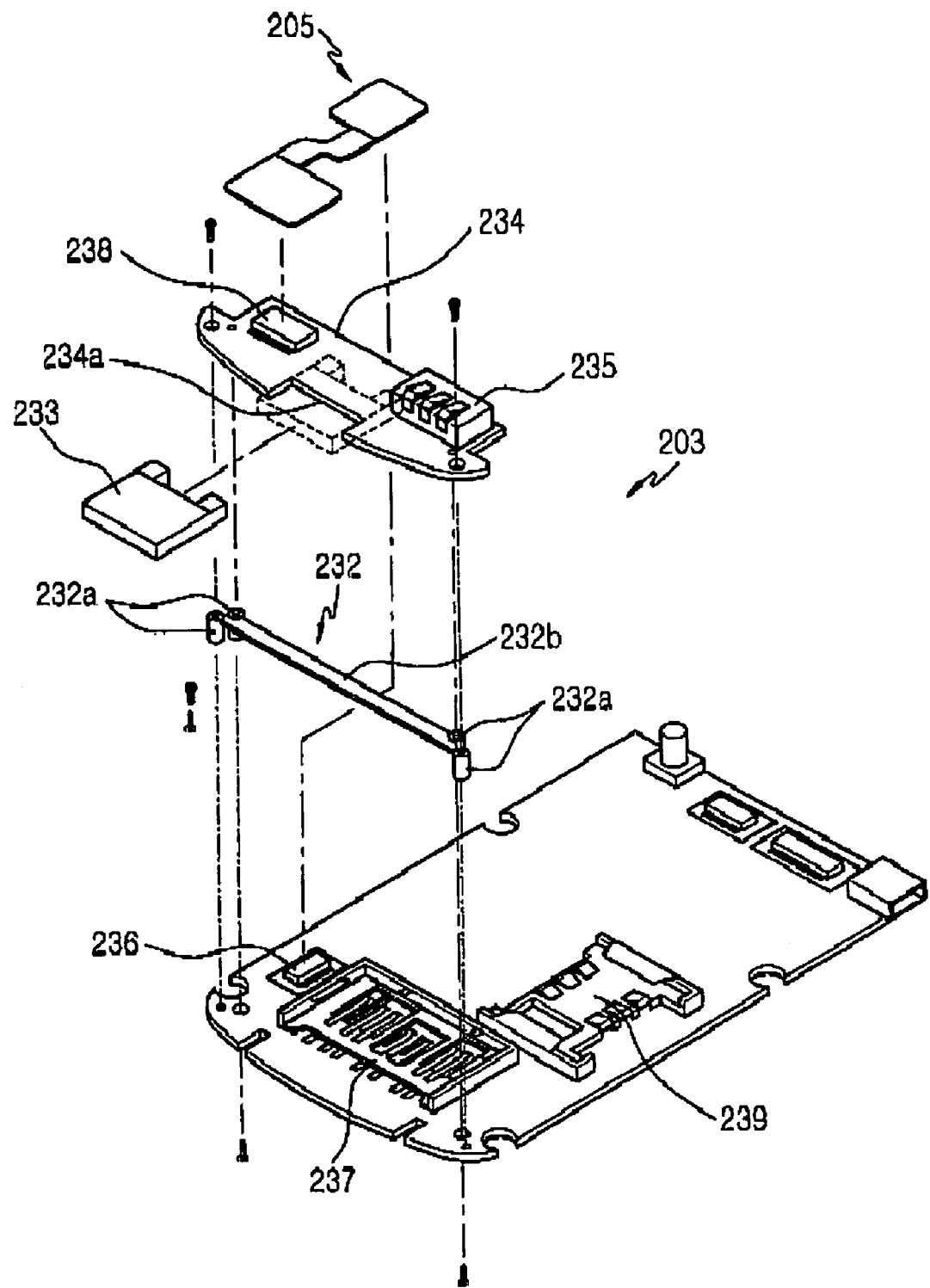
FIG. 4 is a perspective view showing a rear surface of a main board of the portable terminal shown in FIG. 3.

FIG. 3 is an exploded perspective view showing a portable terminal 200 equipped with a main board 203 according to a preferred embodiment of the present invention, and FIG. 4 is a perspective view showing a rear surface of the main board 203 of the portable terminal 200 shown in FIG. 3. For purpose of the following description, the portable terminal 200 is shown in FIG. 3 as a folder-type terminal includes a main body 201 and a folder 202, through one of skill in the art will recognize that the invention described herein is not specific and is applicable all types of portable terminals.

The main body 201 includes a front case 201a and a rear case 201b. The front case 201a is equipped with a key pad 211 and a transmitting unit 213, and the main board 203 is installed in the front case 201 a of the main body 201.

The folder 202 is hingably connected to the main body 201, and is rotatably movable between an open position and a closed position with respect to the main body 201. A camera lens 204 is mounted between the main body 201 and the folder 202, that is, on a hinge unit, in such a manner that image communication and photographing of a desired subject can be achieved using the portable terminal 200.

A plurality of dome switches 231, which are aligned with corresponding to key buttons, form the key pad 211 and are mounted on a front surface of the main board 203 in such a manner that the dome switches 231 can generate electric signals as the user operates the key buttons.

Referring to FIG. 4, a socket 237 for receiving a memory card therein, a SIM-card socket 239, and a battery terminal connector 235 are mounted on a rear surface of the main board 203.

The socket 237, the interface connector 233, and the battery terminal connector 235 overlap each other at the rear surface of the main board 203. First, the socket 237 is attached to the rear surface of the main board 203, and the interface connector 233 and the battery terminal connector 235 are mounted on a Printed Circuit Board (PCB) 234, which is separately provided and attached to the main board 203. Since the PCB 234 is mounted on an upper surface of the socket 237, the socket 237, the interface connector 233, and the battery terminal connector 235 form a stacked structure. To allow the socket 237 and the interface connector 233 to be connected to a memory card and a connector cable, respectively, the socket 237 and the interface connector 233 are mounted at an edge of the main board 203.

The PCB 234 is formed at a predetermined edge portion thereof with a coupling hole 234a having a shape corresponding to a shape of the interface connector 233. In addition, the PCB 234 is provided at an upper surface thereof with the battery terminal connector 235. The battery terminal connector 235 is installed at one side of the interface connector 233, substantially parallel with the interface connector 233.

The main board 203 includes a connector device for connecting the interface connector 233 and the battery terminal connector 235 to the main board 203. The connector device includes a first connector 236 mounted on the main board 203, a second connector 238 mounted on the PCB 234, and a flexible printed circuit board 205 electrically connecting the first connector 236 to the second connector 238.

In order to mount the PCB 234 equipped with the interface connector 233 and the battery terminal connector 235 on an upper surface of the socket 237, the main board 203 includes a bracket 232.

The bracket 232 includes coupling units 232a extending upward from the main board 203 from both sides of the socket 237, and a supporting unit 232b for connecting upper ends of the coupling units 232a with each other while passing through an upper portion of the socket 237. The coupling unit 232a of the bracket 232 is mounted at both sides of the socket 237 with a column structure, such that the PCB 234 can be stably fixed on the main board 203. The coupling unit 232a is formed at both ends thereof with coupling holes. One end of the coupling unit 232a is coupled to the main board 203, preferably by means of a screw, and the PCB 234 is fixed to the other end of the coupling unit 232a, preferably by means of a screw. The supporting unit 232b supports a lower portion of the PCB 234 and prevents the PCB 234 from being bent by an external force and prevents the PCB 234 from interfering with an internal space of the socket 237.

Since the interface connector 233 and the battery terminal connector 235 are mounted on the socket 237 as a stacked structure, the interface connector 233 and the battery terminal connector 235 protrude from an upper surface of the main board 203. Accordingly, a receiving recess 219 (FIG. 3) is formed at a lower end of the rear case 201b in order to receive the interface connector 233 and the battery terminal connector 235, and an opening 217 for exposing the socket 237 and the interface connector 233 is provided. The receiving recess 219 can be formed at an inner portion of the rear case 201b by partially reducing a battery mounting space (not shown).

Meanwhile, a mounting hole 215 is formed at the rear case 201b to expose the SIM-card socket 239. A SIM-card having information to identify a user, such as mobile phone subscription information, is inserted into the mounting hole 215.

As described above, according to the present invention, the main board of the portable terminal is provided at a predetermined portion thereof with a stacked structure of the socket for receiving the memory card, the interface connector, and the battery terminal, thereby minimizing a mounting space for the above elements and ensuring sufficient mounting space for installing other parts. Thus, the part mounting space can be efficiently utilized. In contrast, the conventional main board positions the interface connector differently from the socket so that openings for exposing the interface connector and the socket must be formed in different positions with covers therefor, which negatively affects the assembly process for the portable terminal. However, according to the present invention, the socket and the interface connector are located adjacently to each other, and the socket and the interface connector are exposed through one opening, thereby saving space and allowing for more efficient assembly of the portable terminal.

While the invention has been shown and described with reference to certain preferred embodiments thereof, it will be understood by those skilled in the art that various changes in form and details may be made therein without departing from the spirit and scope of the invention, as defined by the appended claims.

What is claimed is:

1. A main board of a portable terminal, the main board comprising:
    a socket for receiving an additional device installed at one side of the main board;
    an interface connector attached to a Printed Circuit Board (PCB); and
    a battery terminal connector attached to the PCB, wherein the PCB is mounted on the socket so that the interface connector and the battery terminal connector form a stacked structure together with the socket and protrude from an upper surface of the socket.

2. The main board as claimed in claim 1, wherein the battery terminal connector is attached to one side of the interface connector, substantially parallel with the interface connector.

3. The main board as claimed in claim 1, further comprising:
    a bracket including a coupling unit extending from both sides of the socket of the main board; and a supporting unit for connecting upper ends of the coupling unit to each other while passing through an upper portion of the socket, wherein the PCB is supported by the supporting unit and is fixed to the coupling unit.

4. The main board as claimed in claim 1, further comprising:
a first connector provided at one side of the main board,
a second connector provided on the PCB; and
a flexible printed circuit board for connecting the first connector to the second connector.

5. The main board as claimed in claim 1, further comprising a coupling hole having a shape corresponding to a shape of the interface connector, wherein the interface connector is fixed to the coupling hole.

* * * * *